(12) United States Patent
Ma et al.

(10) Patent No.: US 11,830,905 B2
(45) Date of Patent: *Nov. 28, 2023

(54) TERAHERTZ DETECTOR BASED ON SCHOTTKY CONTACT RASTERIZATION STRUCTURE

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

(*) Notice: Subject to any disclaimer, the term of this patent is extended or adjusted under 35 U.S.C. 154(b) by 247 days.

This patent is subject to a terminal disclaimer.

(21) Appl. No.: 17/203,351

(22) Filed: Mar. 16, 2021

(65) Prior Publication Data
US 2022/0068992 A1 Mar. 3, 2022

(30) Foreign Application Priority Data
Sep. 3, 2020 (CN) .......................... 202010916117.X

(51) Int. Cl.
*H01L 27/146* (2006.01)
*G01J 1/44* (2006.01)
*H01L 29/872* (2006.01)

(52) U.S. Cl.
CPC .......... *H01L 27/14669* (2013.01); *G01J 1/44* (2013.01); *H01L 29/872* (2013.01); *G01J 2001/446* (2013.01)

(58) Field of Classification Search
CPC .... H01L 27/14669; H01L 29/872; G01J 1/44; G01J 2001/446
See application file for complete search history.

(56) References Cited

U.S. PATENT DOCUMENTS 11,460,398 B2 * 10/2022 Ma ...................... H01L 27/1443
11,523,069 B2 * 12/2022 Ma ............................ G01J 1/42
(Continued)

FOREIGN PATENT DOCUMENTS

KR    2012040023 A  *  4/2012  ................ H01P 7/08
KR    101595082 B1  *  2/2016  ............ H01L 29/872

OTHER PUBLICATIONS

Caufield, "What's the Difference Between Ray Tracing and Rasterization?", Mar. 19, 2018, NVIDIA Blog, obtained from https://blogs.nvidia.com/blog/2018/03/19/whats-difference-between-ray-tracing-rasterization/ on Jan. 9, 2023 (Year: 2023).*

(Continued)

*Primary Examiner* — David P Porta
*Assistant Examiner* — Casey Bryant
(74) *Attorney, Agent, or Firm* — Yong Chen

(57) ABSTRACT

The present disclosure discloses a terahertz detector based on a Schottky contact grating structure. THz response frequency points are adjusted by adjusting parameters (a grating width, a grating length, a grating region area, a grating period, and a grating pattern form) of the Schottky contact grating structure (in the detector design stage, the grating structure parameters can be adjusted according to the actually required detection frequency points (single frequency point or multiple frequency points)), thereby realizing single-frequency detection or realizing that one detector supports the detection of multiple frequency points. The grating is introduced into the Schottky Barrier Diode, so that the grated Schottky contact resonates with the terahertz waves, the plasma resonance effect is enhanced, and the detection sensitivity is further improved.

6 Claims, 1 Drawing Sheet

(56) References Cited

U.S. PATENT DOCUMENTS

| | | | |
|---|---|---|---|
| 2020/0335639 A1* | 10/2020 | Park | H01L 21/28581 |
| 2021/0041289 A1* | 2/2021 | Iimori | H04N 5/33 |
| 2022/0070390 A1* | 3/2022 | Ma | G01J 5/24 |

OTHER PUBLICATIONS

Zhang et al., A Novel 220-GHz GaN Diode On-Chip Tripler With High Driven Power, May 2019, IEEE Electron Device Letters, vol. 40, No. 5, pp. 780-783 (Year: 2019).*

Jung et al.—KR 10-1595082 B1—PE2E Search English obtained Jan. 11, 2023 (Year: 2023).*

* cited by examiner

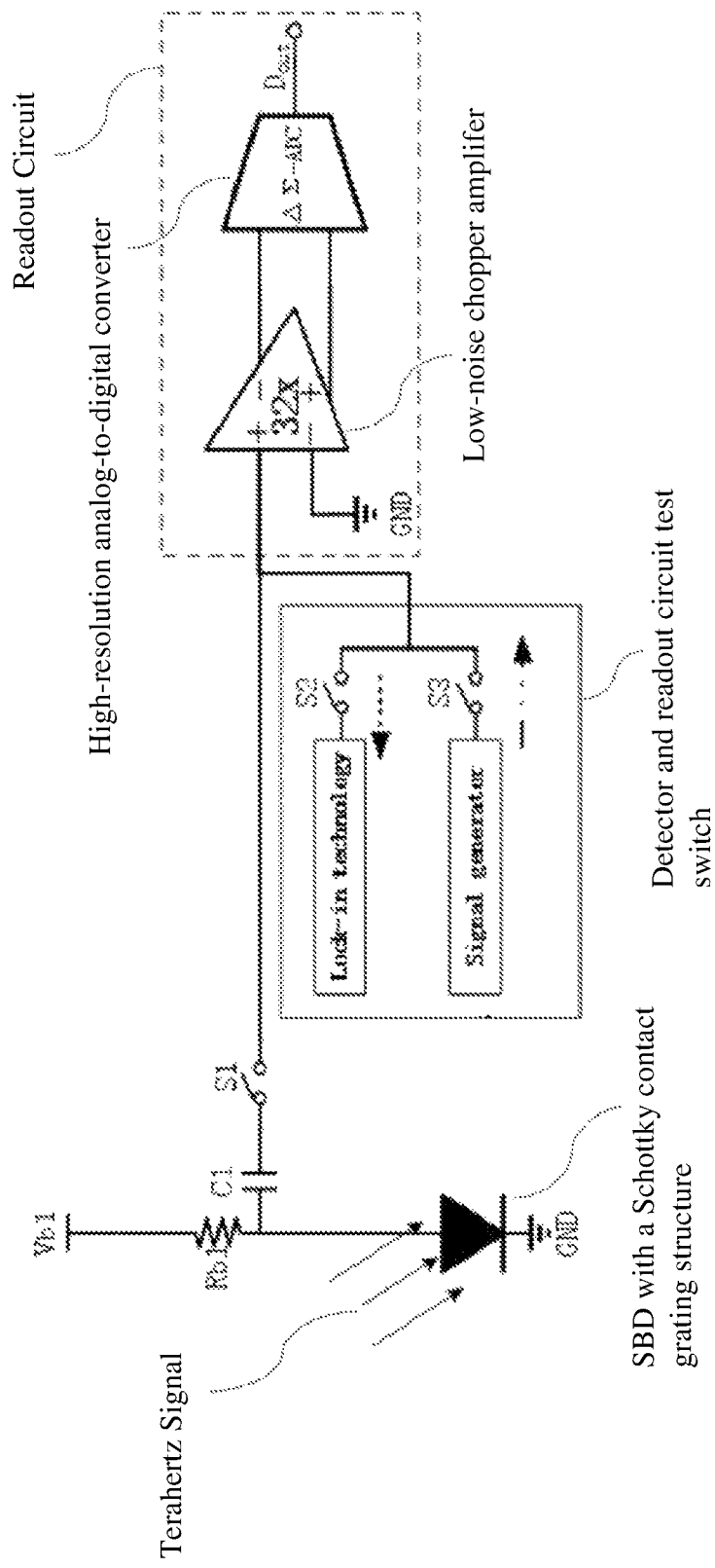

TERAHERTZ DETECTOR BASED ON SCHOTTKY CONTACT RASTERIZATION STRUCTURE

CROSS-REFERENCE TO RELATED APPLICATIONS

The present application claims the priority of Chinese patent application No. 202010916117.X, filed on Sep. 3, 2020, which is hereby incorporated by reference in its entirety.

TECHNICAL FIELD

The present disclosure relates to the technical field of terahertz detectors, and in particular to a terahertz detector based on a Schottky contact grating structure.

TECHNICAL BACKGROUND

A terahertz frequency band refers to a region of electromagnetic radiation having a frequency of 0.1 to 10 THz and a wavelength of 30 μm to 3 mm and between millimeter waves and infrared light, also called T-Ray. The terahertz frequency band is located at the boundary between optics and electronics, called sub-millimeter waves in the field of radio physics, and called far infrared radiation in the field of optics. For a long time, due to a variety of technical reasons, especially due to the lack of effective THz signal generation and detection methods, people have very limited understanding of the terahertz wave band. The development of microwave millimeter waves and infrared optics is relatively mature. The terahertz wave band between the two is the last frequency window in the electromagnetic spectrum to be fully studied, and is called the terahertz "blank" in the electromagnetic spectrum. At present, THz waves and their applications have become a hot spot in the scientific community.

Terahertz detection technology is an extension of the scientific application of terahertz. At present, the focus of research on the terahertz detection technology is to improve the performance of radiation sources and detectors. Schottky Barrier Diodes have the advantages of fast speed, good nonlinear effects, ability to work at room temperature and easy integration, so they are often used as frequency mixer and detector diodes in terahertz detectors. The traditional terahertz detectors based on Schottky Barrier Diodes all use antennas to receive terahertz waves, and the antenna has low gain and large area in the terahertz frequency band, resulting in poor performance and high cost of detectors, which seriously hinders the development of terahertz detection technology.

SUMMARY

An objective of the present disclosure is to overcome the shortcomings of the prior art and provide a terahertz detector based on a Schottky contact grating structure, which is intended to improve the performance of the terahertz detector based on Schottky Barrier Diodes and reduce the cost of the detector.

In order to achieve the above objective, the technical solution provided by the present disclosure is:

A terahertz detector based on a Schottky contact grating structure, comprising:
a Schottky barrier diode (SBD) with a Schottky contact grating structure, a bias voltage Vb1, a bias resistor Rb1, a DC blocking capacitor C1, a switch S1, a detector and readout circuit test switch and a readout circuit;

wherein an anode of the SBD with the Schottky contact grating structure is separately connected to one end of the bias resistor Rb1 and one end of the DC blocking capacitor C1, and a cathode thereof is grounded;

the other end of the bias resistor Rb1 is connected to the bias voltage Vb1, and is used to supply power to the SBD with the Schottky contact grating structure;

the other end of the DC blocking capacitor C1 is connected to one end of the switch S1, and the other end of the switch S1 is connected to the readout circuit;

the detector and readout circuit test switch is connected between the switch S1 and the readout circuit.

Further, the SBD with the Schottky contact grating structure is an SBD in which a Schottky contact is converted into a grated structure, and has a grate-like trench.

Further, parameters of the Schottky contact grating structure include a grating width, a grating length, a grating region area, a grating period, and a grating pattern form, and terahertz response frequency points are adjusted through these parameters.

Further, the SBD with the Schottky contact grating structure is a Shallow Trench Separated SBD or Polysilicon-Gate Separated SBD.

Further, the readout circuit comprises a low-noise chopper amplifier and a high-resolution analog-to-digital converter; the low-noise chopper amplifier is connected between the switch S1 and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

Further, the detector and readout circuit test switch comprises a detector test switch S2 and a readout circuit test switch S3; and the detector test switch S2 and the readout circuit test switch S3 are separately connected between the switch S1 and the readout circuit.

Compared with the prior art, the principle and advantages of the present solution are as follows:

1. The grating is introduced into the Schottky Barrier Diode, so that the grated Schottky contact resonates with the terahertz waves, the plasma resonance effect is enhanced, and the detection sensitivity is further improved.
2. There is no need to use an antenna, which can effectively avoid the problems such as large loss of the on-chip antenna, low gain efficiency, and difficulty in verifying through DRC design rules; and the chip area is greatly reduced, which greatly reduces the production cost.
3. Under the premise that there is a terahertz source, the grating structure parameters can be adjusted according to actual needs to realize single-frequency detection at any frequency point or realize that one detector supports the detection of multiple different frequency points.
4. The introduction of the detector and readout circuit test switch can test the detector and the readout circuit separately when the circuit fails so as to accurately determine the cause and location of the specific failure.
5. The idea of the grating of the gate is proposed and it is combined with the Schottky Barrier Diode (SBD). Through a periodic SBD structure, a grate-like trench is formed in the trench to realize the enhancement of resonance between plasmons in the substrate and plasmonic behavior in the gate; and the method of the grated gate can be used to reduce the problems such as weak terahertz signals in the space, weak plasmonic behavior excited by the metal structure on the gate, and diffusion and loss in the propagation process.

BRIEF DESCRIPTION OF THE DRAWINGS

In order to more clearly illustrate the technical solutions in embodiments of the present disclosure or the prior art, the measures that need to be used in the description of the embodiments or the prior art will be briefly described below. Obviously, the drawings in the following description are only some embodiments of the present disclosure, and other drawings can be obtained by those of ordinary skill in the art from these without creative efforts.

FIG. 1 is a schematic structural diagram of a terahertz detector based on a Schottky contact grating structure according to the present disclosure.

DETAILED DESCRIPTION OF THE EMBODIMENTS

The present disclosure will be further described below in conjunction with specific embodiments:

As shown in the only FIGURE, a terahertz detector based on a Schottky contact grating structure comprises an SBD with a Schottky contact grating structure, a bias voltage Vb1, a bias resistor Rb1, a DC blocking capacitor C1, a switch S1, a detector and readout circuit test switch and a readout circuit. An anode of the SBD with the Schottky contact grating structure is separately connected to one end of the bias resistor Rb1 and one end of the DC blocking capacitor C1, and a cathode thereof is grounded; the other end of the bias resistor Rb1 is connected to the bias voltage Vb1, and is used to supply power to the SBD with the Schottky contact grating structure; the other end of the DC blocking capacitor C1 is connected to one end of the switch S1, and the other end of the switch S1 is connected to the readout circuit; and the detector and readout circuit test switch is connected between the switch S1 and the readout circuit.

Specifically, the SBD with the Schottky contact grating structure adopted in this embodiment is a Shallow Trench Separated (STS) SBD or Polysilicon-Gate Separated (PGS) SBD. The Shallow Trench Separated SBD or Polysilicon-Gate Separated SBD is an SBD in which a Schottky contact is converted into a grated structure, and has a grate-like trench. Its parameters of the SBD with the Schottky contact grating structure include a grating width, a grating length, a grating region area, a grating period, and a grating pattern form, so that under the premise that there is a terahertz source, the grating structure parameters may be adjusted according to actual needs to realize the single-frequency detection at any frequency point or realize that one detector supports the detection of multiple different frequency points.

Specifically, the readout circuit includes a low-noise chopper amplifier and a high-resolution analog-to-digital converter; the low-noise chopper amplifier is connected between the switch S1 and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

The detector and readout circuit test switch includes a detector test switch S2 and a readout circuit test switch S3; and the detector test switch S2 and the readout circuit test switch S3 are separately connected between the switch S1 and the readout circuit. It is mainly convenient to test the detector and the readout circuit separately in the process of circuit failure, so as to determine the specific cause and location of the failure.

In this embodiment, the specific working process of the terahertz detector is as follows:

When the switch S1 is closed, the detector test switch S2 is opened, and the readout circuit test switch S3 is opened, a terahertz signal received by the terahertz detector is amplified by the low-noise chopper amplifier, and thereafter enters the high-resolution analog-to-digital converter for digital processing and is then outputted from $D_{out}$;

When the switch S1 is closed, the detector test switch S2 is closed, and the readout circuit test switch S3 is opened, the performance test of the terahertz detector is performed, and if a terahertz signal can be received, then it indicates that the terahertz detector is working normally, otherwise the terahertz detector is malfunctioning.

When the switch S1 is opened, the detector test switch S2 is opened, and the readout circuit test switch S3 is closed, the performance test of the readout circuit is performed. If a signal digitized by the high-resolution analog-to-digital converter is normally outputted at $D_{out}$, then it indicates that the readout circuit is working normally, otherwise the readout circuit is malfunctioning.

In the terahertz detector described in this embodiment, THz response frequency points are adjusted by adjusting parameters (a grating width, a grating length, a grating region area, a grating period, and a grating pattern form) of the Schottky contact grating structure (in the detector design stage, the grating structure parameters can be adjusted according to the actually required detection frequency points (single frequency point or multiple frequency points)), thereby realizing single-frequency detection or realizing that one detector supports the detection of multiple frequency points. The grating is introduced into the Schottky Barrier Diode, so that the grated Schottky contact resonates with the terahertz waves, the plasma resonance effect is enhanced, and the detection sensitivity is further improved.

The embodiments described above are only exemplary embodiments of the present disclosure, and do not limit the scope of implementation of the present disclosure. Therefore, any changes made according to the shape and principle of the present disclosure should be covered by the scope of protection of the present disclosure.

What is claimed is:

1. A terahertz detector including a Schottky contact grating structure, comprising:
   a Schottky barrier diode (SBD) with a Schottky contact grating structure, a bias voltage Vb1, a bias resistor Rb1, a DC blocking capacitor C1, a switch S1, a detector and readout circuit test switch and a readout circuit;
   wherein an anode of the SBD with the Schottky contact grating structure is separately connected to one end of the bias resistor Rb1 and one end of the DC blocking capacitor C1, and a cathode thereof is grounded;
   the other end of the bias resistor Rb1 is connected to the bias voltage Vb1, and is used to supply power to the SBD with the Schottky contact grating structure;
   the other end of the DC blocking capacitor C1 is connected to one end of the switch S1, and the other end of the switch S1 is connected to the readout circuit;
   the detector and readout circuit test switch is connected between the switch S1 and the readout circuit.

2. The terahertz detector including the Schottky contact grating structure according to claim 1, wherein the SBD with the Schottky contact grating structure is an SBD in which a Schottky contact is converted into a grated structure, and has a grate-like trench.

3. The terahertz detector including the Schottky contact grating structure according to claim 2, wherein parameters of the Schottky contact grating structure include a grating width, a grating length, a grating region area, a grating period, and a grating pattern form, and these parameters are used to realize single-frequency detection at any frequency point or realize that one detector unit supports detection of multiple different frequency points.

4. The terahertz detector including the Schottky contact grating structure according to claim 3, wherein the SBD with the Schottky contact grating structure is a Shallow Trench Separated SBD or Polysilicon-Gate Separated SBD.

5. The terahertz detector including the Schottky contact grating structure according to claim 1, wherein the readout circuit comprises a low-noise chopper amplifier and a high-resolution analog-to-digital converter; the low-noise chopper amplifier is connected between the switch S1 and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

6. The terahertz detector including the Schottky contact grating structure according to claim 1, wherein the detector and readout circuit test switch comprises a detector test switch S2 and a readout circuit test switch S3; and the detector test switch S2 and the readout circuit test switch S3 are separately connected between the switch S1 and the readout circuit.

* * * * *